US011800687B2

(12) United States Patent
Trygubova et al.

(10) Patent No.: US 11,800,687 B2
(45) Date of Patent: Oct. 24, 2023

(54) HEAT TRANSFER ASSEMBLY

(71) Applicant: DISH Network L.L.C., Englewood, CO (US)

(72) Inventors: SvitLana Trygubova, Lakewood, CO (US); Steven Allen Nedved, Littleton, CO (US)

(73) Assignee: DISH Network L.L.C., Englewood, CO (US)

( * ) Notice: Subject to any disclaimer, the term of this patent is extended or adjusted under 35 U.S.C. 154(b) by 19 days.

(21) Appl. No.: 17/446,031

(22) Filed: Aug. 26, 2021

(65) Prior Publication Data

US 2023/0066818 A1 Mar. 2, 2023

(51) Int. Cl.
*H05K 7/20* (2006.01)
*H05K 9/00* (2006.01)

(52) U.S. Cl.
CPC ....... *H05K 7/20481* (2013.01); *H05K 7/2049* (2013.01); *H05K 7/20509* (2013.01); *H05K 9/0024* (2013.01)

(58) Field of Classification Search
CPC ............. H05K 7/20481; H05K 7/2049; H05K 7/20509; H05K 9/0024
USPC .................................................. 361/679.54
See application file for complete search history.

(56) References Cited

U.S. PATENT DOCUMENTS

| 4,333,101 A | 6/1982 | York |
|---|---|---|
| 4,530,003 A | 7/1985 | Blair et al. |
| 4,710,852 A | 12/1987 | Keen |
| 4,914,551 A | 4/1990 | Anschel et al. |
| 5,287,247 A | 2/1994 | Smits et al. |
| 5,367,196 A | 11/1994 | Mahulikar et al. |
| 5,801,330 A | 9/1998 | Gademann et al. |
| 5,917,701 A | 6/1999 | Solberg |
| 5,940,271 A | 8/1999 | Mertol |
| 5,977,622 A | 11/1999 | Mertol |
| 6,049,469 A | 4/2000 | Hood et al. |

(Continued)

FOREIGN PATENT DOCUMENTS

CN          102651354 A          8/2012

OTHER PUBLICATIONS

PCT/US2016/058196, "International Preliminary Report on Patentability", dated Jul. 3, 2018.

(Continued)

*Primary Examiner* — Anatoly Vortman
(74) *Attorney, Agent, or Firm* — Wash Park IP Ltd.; John T Kennedy

(57) ABSTRACT

A heat transfer assembly includes a heat plate coupled to a spring and to a graphite sheet. The spring is at first location corresponding to a heat source in an assembled device. The graphite sheet extends over at least a middle portion of the spring and over portions of the heat plate. The graphite sheet is coupled to a thermal pad positioned above a given surface of the heat source. The spring provides a compressive force on the thermal pad when the device is in an assembled state. The compressive force enhances thermal conductivity between the heat source and the heat transfer assembly. The heat plate may be positioned within and thermally coupled to a cover of the device. Principally by use of the thermal pad, graphite sheet, and thermal plate, heat generated by the heat source is transferred to the cover and then to the external environment.

20 Claims, 11 Drawing Sheets

(56) References Cited

U.S. PATENT DOCUMENTS

| | | |
|---|---|---|
| 6,182,958 B1 | 2/2001 | Sidone et al. |
| 6,212,074 B1 | 4/2001 | Gonsalves et al. |
| 6,226,184 B1 | 5/2001 | Stolz et al. |
| 6,251,707 B1 | 6/2001 | Bernier et al. |
| 6,462,951 B2 | 10/2002 | Letourneau |
| 6,706,563 B2 | 3/2004 | Shim et al. |
| 6,791,183 B2 | 9/2004 | Kanelis |
| 6,806,567 B2 | 10/2004 | Hembree |
| 7,130,193 B2 | 10/2006 | Hirafuji et al. |
| 7,170,750 B2 | 1/2007 | Tanaka |
| 7,203,065 B1 | 4/2007 | Sin Yan Too |
| 7,315,445 B2 | 1/2008 | Kirby et al. |
| 7,388,747 B2 | 6/2008 | Yang et al. |
| 7,641,505 B2 | 1/2010 | Ma |
| 7,883,357 B2 | 2/2011 | Lin et al. |
| 8,154,880 B1 | 4/2012 | Bicknell |
| 8,363,411 B2 | 1/2013 | Stephens et al. |
| 8,544,745 B2 | 10/2013 | Mullins et al. |
| 8,766,093 B2 | 7/2014 | Lee et al. |
| 8,902,588 B2 | 12/2014 | Ritter et al. |
| 8,947,881 B2 | 2/2015 | Aspas et al. |
| 10,356,948 B2 | 7/2019 | Trygubova |
| 10,721,840 B2* | 7/2020 | Trygubova .............. F28F 9/002 |
| 11,229,114 B2* | 1/2022 | Eto ..................... H01L 23/4006 |
| 2004/0052052 A1 | 3/2004 | Rivera |
| 2004/0201964 A1 | 10/2004 | Sigl et al. |
| 2004/0207985 A1 | 10/2004 | Delano et al. |
| 2005/0248923 A1 | 11/2005 | Hsu |
| 2006/0087816 A1* | 4/2006 | Ewes ................... H01L 23/427 |
| | | 257/E23.088 |
| 2006/0187645 A1 | 8/2006 | Numata |
| 2006/0215357 A1 | 9/2006 | Green et al. |
| 2006/0215368 A1* | 9/2006 | Tsai ..................... H01L 23/433 |
| | | 257/E23.09 |
| 2007/0030656 A1 | 2/2007 | Ross et al. |
| 2007/0146990 A1* | 6/2007 | Hsieh ....................... G06F 1/20 |
| | | 257/E23.09 |
| 2007/0146996 A1 | 6/2007 | Herring et al. |
| 2008/0053640 A1 | 3/2008 | Mok |
| 2008/0291638 A1 | 11/2008 | Ma et al. |
| 2010/0027220 A1 | 2/2010 | Hughes et al. |
| 2010/0097768 A1 | 4/2010 | Ishii et al. |
| 2013/0033823 A1 | 2/2013 | Nagashima et al. |
| 2013/0063895 A1* | 3/2013 | Ritter .................. H01L 23/3677 |
| | | 361/692 |
| 2013/0141866 A1* | 6/2013 | Refai-Ahmed ..... H01L 23/3672 |
| | | 361/679.54 |
| 2014/0022733 A1* | 1/2014 | Lim ................... H05K 7/20445 |
| | | 361/718 |
| 2014/0146479 A1 | 5/2014 | Kilroy et al. |
| 2014/0239488 A1* | 8/2014 | Kobayashi ............ H01L 23/367 |
| | | 257/718 |
| 2014/0293546 A1* | 10/2014 | Wu .................... H05K 7/20509 |
| | | 252/78.3 |
| 2014/0376187 A1* | 12/2014 | Baba ...................... H05K 1/021 |
| | | 361/699 |
| 2015/0230363 A1 | 8/2015 | Dernier |
| 2015/0268704 A1* | 9/2015 | Chiriac ................... F28F 21/00 |
| | | 165/185 |
| 2017/0196121 A1* | 7/2017 | Trygubova .......... H05K 7/2049 |
| 2019/0110373 A1* | 4/2019 | Trygubova .......... H05K 5/0004 |
| 2020/0305304 A1* | 9/2020 | Trygubova .......... H05K 7/2049 |
| 2020/0359525 A1* | 11/2020 | Eto ......................... H01L 23/42 |

OTHER PUBLICATIONS

PCT/US2010/058196, "International Search Report and Written Opinion", dated Jan. 30, 2017.

EPO Application Serial No. 18780273.1, 1st Examination Report, dated May 30, 2022.

U.S. Appl. No. 16/896,616, Non-final Office Action, dated Jun. 6, 2022.

Application No. PCT/US2018/050372, International Search Report and Written Opinion, dated Dec. 19, 2018, 14 pages.

EPO App Serial No. 18780273.1, Response to Rule 161 Communication, dated Oct. 21, 2020.

EPO Application Serial No. 18780273.1, Rule 161 Communication, dated May 19, 2020.

PCTUS2018050372, Notice of Mailing and International Preliminary Report on Patentability and Written Opinion, dated Apr. 23, 2020.

EPO App Serial No. 18780273.1, Response to Examination Report, dated Sep. 27, 2022.

U.S. Appl. No. 16/896,616, Final Office Action, dated Oct. 20, 2022.

U.S. Appl. No. 16/896,616, Response to Non-Final Office Action, dated Aug. 19, 2022.

U.S. Appl. No. 16/896,616, Advisory Action, dated Dec. 21, 2022.

U.S. Appl. No. 16/896,616, Non-final Office Action, dated Feb. 28, 2023.

U.S. Appl. No. 16/896,616, Request for Continued Examination with Amendment, dated Jan. 11, 2023.

U.S. Appl. No. 16/896,616, Response to Final Office Action, dated Dec. 7, 2022.

U.S. Appl. No. 16/896,616, Response to non-final Office Action, dated Jun. 11, 2023.

U.S. Appl. No. 16/896,616, filed Jun. 9, 2020.

U.S. Appl. No. 16/896,616, Notice of Allowance, dated Sep. 7, 2023.

* cited by examiner

```
┌─────────────────────────────────────────────────────────────┐
│   CONFIGURE A HEAT PLATE TO CORRESPOND TO A COVER FOR A DEVICE │
│                           602                                │
└─────────────────────────────────────────────────────────────┘
                              │
┌─────────────────────────────────────────────────────────────┐
│     ATTACH A SPRING ONTO THE HEAT PLATE AT A FIRST LOCATION  │
│                           604                                │
└─────────────────────────────────────────────────────────────┘
                              │
┌─────────────────────────────────────────────────────────────┐
│   WHEREIN THE FIRST LOCATION CORRESPONDS TO A MIDDLE PORTION │
│   OF THE SPRING AND, WHEN THE DEVICE IS IN AN ASSEMBLED STATE, A │
│    TOP SURFACE OF A HEAT SOURCE WITHIN THE DEVICE            │
│                           606                                │
└─────────────────────────────────────────────────────────────┘
                              │
┌─────────────────────────────────────────────────────────────┐
│         ATTACH A GRAPHITE SHEET TO THE HEAT PLATE            │
│                           608                                │
└─────────────────────────────────────────────────────────────┘
                              │
┌─────────────────────────────────────────────────────────────┐
│  ATTACH THE GRAPHITE SHEET TO EXTEND OVER THE MIDDLE PORTION │
│                      OF THE SPRING                           │
│                           610                                │
└─────────────────────────────────────────────────────────────┘
                              │
┌─────────────────────────────────────────────────────────────┐
│    ATTACH A THERMAL PAD TO THE GRAPHITE SHEET AT THE FIRST   │
│                         LOCATION.                            │
│                           612                                │
└─────────────────────────────────────────────────────────────┘
```

FIG. 6

HEAT TRANSFER ASSEMBLY

TECHNICAL FIELD

The technology described herein generally relates to devices, systems, and methods for transferring heat from a component within an electronic device to an external environment. More particularly, the various implementations disclosed herein generally relate to heat transfer assemblies configured to transfer heat from microprocessors, memory devices, and other components in electronic devices to an external environment.

BACKGROUND

Devices, including electronic devices such as set-top box assemblies, computers, smart phones, vehicle control systems, and others, commonly include one or more components that generate a heat (herein, a "heat source"). Such heat often needs to be transferred away from such heat source(s) in a device to facilitate operating conditions for the component within specified ranges. Such heat transfer may often occur by use of thermal conduction between the component and a heat plate or similar assembly (herein, a "heat plate"), where the heat plate is configured to further transfer the heat received from the component into an internal or external environment or to other components. Commonly, the heat plate uses thermal transfer mechanisms such as conduction, convection, radiation, evaporative cooling, active cooling, and other approaches known in the art for transferring heat.

More specifically, one approach for heat transfer in devices is to use a heat transfer assembly to conduct heat away from one or more components in the device and across a wider area to enhance convective heat dissipation. Such a heat transfer assembly often extends across a substantial portion of one or more of a device's surface enclosures, such as across a top enclosure, a side enclosure, or a bottom enclosure. The one or more heat transfer assemblies are often configured to contact one or more heat sources in the device, while often not contacting other non-heat generating components. That is, the heat transfer assembly is often configured to transfer heat away from the one or more heat sources and not transfer such heat to other components. Often the heat transfer assembly needs to establish a firm contact with a heat source to transfer heat efficiently and effectively. Yet, such heat transfer assemblies are often configured into and/or onto an enclosure of the device, which when in an open configuration does not contact the heat source and, when the device is in a closed or assembled configuration, does directly contact the heat source.

Further, wide variances often exist between physical devices and design tolerances. That is, due to manufacturing variances in component heights, gaps between enclosure surfaces often materialize that present challenges in establishing the specified contact between a heat plate used for a given heat transfer assembly and a given heat generating components. To bridge such gaps while considering the above mentioned and other deviations between design and actual devices, a spring or similar assembly is often used. Examples of uses of such spring members can be found, for example in U.S. Pat. No. 10,356,948, entitled "Self-Adjustable Heat Spreader System for Set-Top Box Assemblies", which issued on Jul. 16, 2019, herein the "948 Patent", and in U.S. Pat. No. 10,721,840, entitled "Heat Spreader Assembly", which issued on Jul. 21, 2020, herein the "840 Patent"; the entire contents of both of which Patents are incorporated herein by reference.

Accordingly, various approaches are known wherein one or more flexible members, or spring-like materials, may be used to bridge gaps and provide a bridge between a component and a heat plate or similar assembly. Such flexible members commonly are referred at heat transfer assemblies and are configured to extend outwards from a heat plate assembly to fill an often-variable gap between a surface of the enclosure and a heat generating component and, when the device is in an assembled configuration. Yet, improvements in heat transfer assemblies are needed for transferring heat from a heat source to a heat plate or other heat transfer assembly element when multiple heat sources are present within a device having a slim box design or an otherwise space limited internal environment.

Further, electronic components are often sensitive to the reception of and/or are sources of Radio Frequency ("RF") signals. Such RF signals may cause interference with other internal and/or external electronic components and devices. Electronic devices are typically manufactured to comply via various RF signal considerations, including but not limited to the generation and/or reception signals which cause electromagnetic interference ("EMI"). Shielding commonly utilized to prevent EMI may interfere with the efficiency of heat transfer assemblies used for a given electronic device.

Accordingly, a need exists for a heat transfer assembly that more effectively transfer heat from a heat source to a heat plate or other heat transfer assembly element for transfer to an internal or external environment for an electronic device. A need also exists for heat transfer assemblies that include RF shields which prevent and/or reduce EMI concerns for a given electronic device. Implementation of solutions to these and other needs are addressed by the present disclosure.

SUMMARY

Various implementations of the present disclosure relate, in general, to heat transfer assemblies configured to conduct heat from heat sources in electronic devices and methods for transferring heat in electronic devices. Various implementations herein, also relate to facilitating heat transfer while reducing EMI considerations for a given heat source, such as an electronic component of an electronic device.

In accordance with at least one implementation, a heat transfer assembly includes a heat plate, a first thermal conductive sheet extending over at least a portion of the heat plate, and a first thermal pad coupled to the first thermal conductive sheet.

Implementations may include one or more of the following features. The heat spreader assembly, during operation of a device, may facilitate thermal transfer of a portion TJ1 of a first heat J1 from a first heat source to an external environment. The device, when assembled in an operative state, may include: a top cover; a bottom cover mechanically coupled to the top cover; a printed circuit board (PCB) fastened to the bottom cover; and the first heat source coupled to the PCB and generating the first heat J1 during device operation. The heat spreader assembly may be configured to transfer the portion TJ1 from the first heat source to the external environment by: first transferring a first portion TJ1 of the first heat J1 from the first heat source to the first thermal pad, and second transferring a second portion T2J1 of the first heat J1 from the first thermal pad to the first thermal conductive sheet.

The heat spreader assembly may be configured to transfer the portion TJ1 from the first heat source to the external environment by: third transferring a third portion T3J1 of the first heat J1 from the first thermal conductive sheet to the heat plate. The heat spreader assembly may transfer the portion TJ from the first heat source to the external environment by: fourth transferring a fourth portion T4J1 of the first heat J1 from the heat plate to the top cover. The heat spreader assembly may transfer the portion TJ2 from the first heat source to the external environment by: fifth transferring a fifth portion T5J1 of the first heat J1 from the top cover to the external environment. For at least one implementation, T1J1>T2J1>T3J1>T4J1>T5J1.

For at least one implementation, a first thermal conductive sheet may extend over a middle portion of a first spring. The first spring may be coupled to a heat plate at a left portion and at a right portion. When the device is assembled, the middle portion of the first spring, compresses and applies a pressure P onto a first thermal pad. The pressure P enhances thermal contact between the first thermal pad and a top surface of a first heat source. The first spring may be configured to transfer a sixth portion T6J1 of the first heat J1 from the first thermal conductive sheet to the heat plate.

For an implementation, a heat spreader assembly may include: a radio frequency (RF) shield positioned between a first heat source and a first thermal pad. A first thermal conductive sheet may extend over a middle portion of a first spring. The first spring may be coupled to the heat plate at a left portion and a right portion. When the device is assembled, the middle portion of the first spring, compresses and applies a pressure P onto the first thermal pad. The pressure P enhances thermal contact between the first thermal pad and a top surface of the first heat source. The RF shield may be electrically grounded. The first heat source further may include at least one of a central processing unit, a graphics processor, and a memory device. The first thermal conductive sheet may include a graphite sheet. The graphite sheet has a thickness. The heat plate may be an aluminum plate. The first thermal pad may include a thermal pad having a thermal flux of 8.5 W/mK over a temperature range of 40 to 150 degrees Celsius.

One general aspect includes a method of assembling a heat spreader assembly. The method of assembling may include configuring a heat plate to correspond to at least a portion of a cover for a device; attaching a thermal conductive sheet to the heat plate; and attaching a thermal pad to the thermal conductive sheet at a first location. The thermal pad, when attached to the thermal conductive sheet and when the device is operative, corresponds to a location in the device above a top surface of a heat source. Via the thermal pad, the thermal conductive sheet, and the heat plate, thermal energy generated by the heat source is spread to other areas in the device and some of the heat is transferred to the cover of the device.

Implementations may include one or more of the following features. The method may include: attaching a spring onto the heat plate; where, when assembled into the device a middle portion of the spring corresponds to an extension of the location of the top surface of the heat source. The method may include extending the thermal conductive sheet over the middle portion of the spring. The spring may be configured to apply a pressure P through the thermal conductive sheet onto the thermal pad which enhances a thermal flux between the thermal pad and the top surface of the heat source. The thermal conductive sheet may include graphite.

BRIEF DESCRIPTION OF THE DRAWINGS

The features, aspects, advantages, functions, modules, and components of the devices, systems and methods provided by the various implementations of the present disclosure are further disclosed herein regarding at least one of the following descriptions and accompanying drawing figures. In the appended figures, similar components or elements of the same type may have the same reference number, such as 108, with an additional alphabetic designator, such as 108a, 108n, etc., wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When the first reference label is used in the specification, the description is applicable to any of the similar components and/or views having the same first reference number irrespective of any additional alphabetic designators or second reference labels, if any.

FIG. 6 is a side, partial cross-sectional view of an electronic device having a heat transfer assembly and a metal shield configured in accordance with at last one implementation of the present disclosure, and where the electronic device is in an assembled state.

DETAILED DESCRIPTION

Figure 1A:
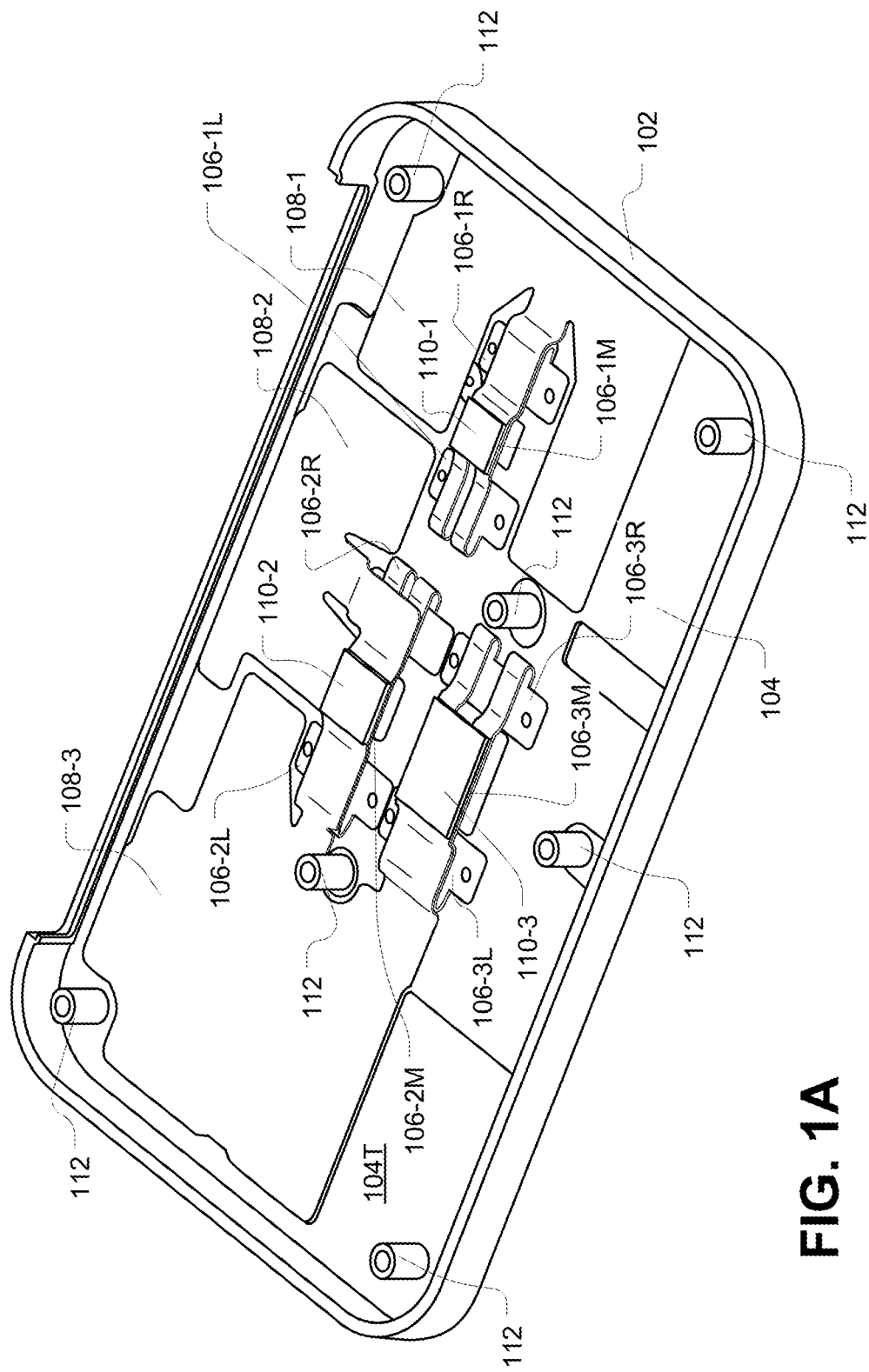
FIG. 1A is a top perspective view of a heat transfer assembly, positioned in a top cover of an electronic device, and in accordance with at least one implementation of the present disclosure.

The various implementations described herein are directed to devices, systems, and methods for using a heat transfer assembly that is configured to transfer heat away from a heat source in a device, such as an electronic device, using a combination of a thermal pad, a thermal conductive sheet, such as a graphite sheet, a spring, a heat plate, and at least one cover for the electronic device. Implementations of heat transfer assemblies of the present disclosure may be configured to both transfer heat more efficiently, by use of a thermal pad that is in direct and/or indirect contact with a heat source and a thermal conductive sheet configured to efficiently transfer heat from the thermal pad to elsewhere within the electronic device. The thermal pad may be coupled to a heat plate which further transfers the heat throughout portions of the device. The heat plate may be coupled to a cover for the electronic device. The cover may be configured to radiate heat into an external environment, such as into a room, or otherwise. The heat transfer assembly may include a spring. The spring may be coupled to the heat plate.

For an implementation and when the device is in an assembled stated, the spring may be configured to establish physical contact of the thermal conductive sheet with the thermal pad and physical contact of the thermal pad directly with the heat source.

For another implementation, a metal shield may be included with the heat transfer assembly. The metal shield may be configured to provide EMI shielding by and/or for a given heat source and/or other component of a device. The thermal pad may be configured to have physical contact with the metal shield on an area in thermal contact with the heat source. The spring may be configured to establish physical contact of a thermal pad with the metal shield.

The dimensions and contours of a heat transfer assembly including the metal shield, if any, thermal pad, thermal conductive sheet, spring, and heat plate may vary be device. The device may be any type of device that generates heat. The heat may be transferred to the device elsewhere using an implementation of the heat transfer assemblies of the present disclosure. Non-limiting examples of such devices include computers, set-top boxes, televisions, smart-phones, automobile electronics, and others. The one or more implementations of such a heat transfer assembly may be configured to improve the efficiency of the device by improving the thermal control properties of such device. It is to be appreciated that improvements in thermal control, for a device, may result in improvements in power, energy use, operating characteristics, and otherwise.

First Implementation of a Heat Transfer Assembly 100

As shown in FIGS. 1A to 1E and in accordance with a first implementation of the present disclosure, a first heat transfer assembly 100 for use in a device 132 (as shown in exploded view in FIG. 1C) to transfer heat to/from a component in the device 132 includes a heat plate ("HP") 104, a spring ("S") 106, a thermal conductive sheet, such as a graphite sheet ("GS") 108, and a thermal pad ("TP") 110. Heat generated by a device component, such as processor, transceiver, signal processor, or otherwise may be transferred away from such device component and elsewhere within a device 132 and to an external environment. Such heat transfer occurs due to thermal coupling of the heat transfer assembly components (e.g., the heat plate 104, spring 106, graphite sheet 108 and thermal pad 110) with the heat source 122. Likewise, in a reverse heat transfer direction, heat may be provided to a given component in the device 132 using an implementation of the heat transfer assembly of the present disclosure. Heat transfer may occur by use of well-known thermodynamic principles including thermal conduction, convection, radiation, combinations thereof, and otherwise.

Active and/or passive thermal control technologies may be used in conjunction with implementations of the first heat transfer assembly 100.

The quantity of heat transfer to be provided by a given implementation of the present disclosure will vary by heat source 122. For example, a first heat source 122-1, such as a digital signal processor, may generate a first quantity of heat (J1) ("J" standing for Joules), while a second heat source 122-2, such as a multi-core central processing unit (CPU), may generate a second quantity of heat (J2), while a third heat source 122-3, such as a memory integrated circuit, may generate a third quantity of heat (J3). Such quantities of heat may be measured in units of Joules, in units of British Thermal Units (BTUs), and/or as calories (herein, Joules are used for purposes of explanation). The quantity of heat transferred (Q) from a source to elsewhere may be measured in units of Watts (i.e., one Joule per second).

Further, a given element of a heat transfer assembly may have one or more thermal properties, such as a first heat transfer rate ($\dot{Q}1$), where the heat transfer rate $\dot{Q}$ is the amount of heat (in Joules) per unit time, which is a function of a heat flux or thermal flux (Fq) of a given material, as expressed in watts per square meter (W/m²).

Based on the amount of Joules generated by a heat source (e.g., J1-J3), specified heat flux and other properties of a given heat transfer assembly element, the various components of a heat transfer assembly 100, per an implementation of the present disclosure, may be selected. For example, properties of a thermal pad 110 to be used with a given heat source 122 generating J1 Joules may vary from implementation to implementation based the specified, needed, or preferred amount of energy Q to be transferred, the rate $\dot{Q}$ of such transfer, and the area from which such heat is to be transferred as measured by the heat flux ("F").

Accordingly, the materials, configurations, and placements (herein, "thermal properties") of one or more heat transfer assembly components within a given device may vary from a first heat source 122-1 to a second heat source 122-3, from a first device 132-1 to a second device 132-2, and with respect to the heat plates, graphite sheets, springs, thermal pads, and otherwise utilized in a given device. Determinations of such thermal properties may be made using simulations, observations, testing, ordinary knowledge and skill, and otherwise.

For at least one implementation, selection of a given thermal property for an element of a heat transfer assembly may be made under any specified environmental conditions. For an implementation, such conditions may include an ambient external environment of forty-five degrees Celsius (45° C.). For an implementation, thermal properties of one or more elements of a heat transfer assembly 100 may be selected such that an external surface temperature of a device, as assembled and operating, does not exceed a specified temperature, such as seventy degrees Celsius (70° C.) and a given heat source 122 does not generate energy such that a surface temperature of such heat source does not exceed ninety degrees Celsius (90° C.). Other temperature ranges may be used for other heat sources 122, devices 132, or otherwise. For at least one implementation, a heat source 122 in a device 132 and a device 132 may have a maximum temperature rating, an operating temperature rating, and otherwise.

Figure 3A:
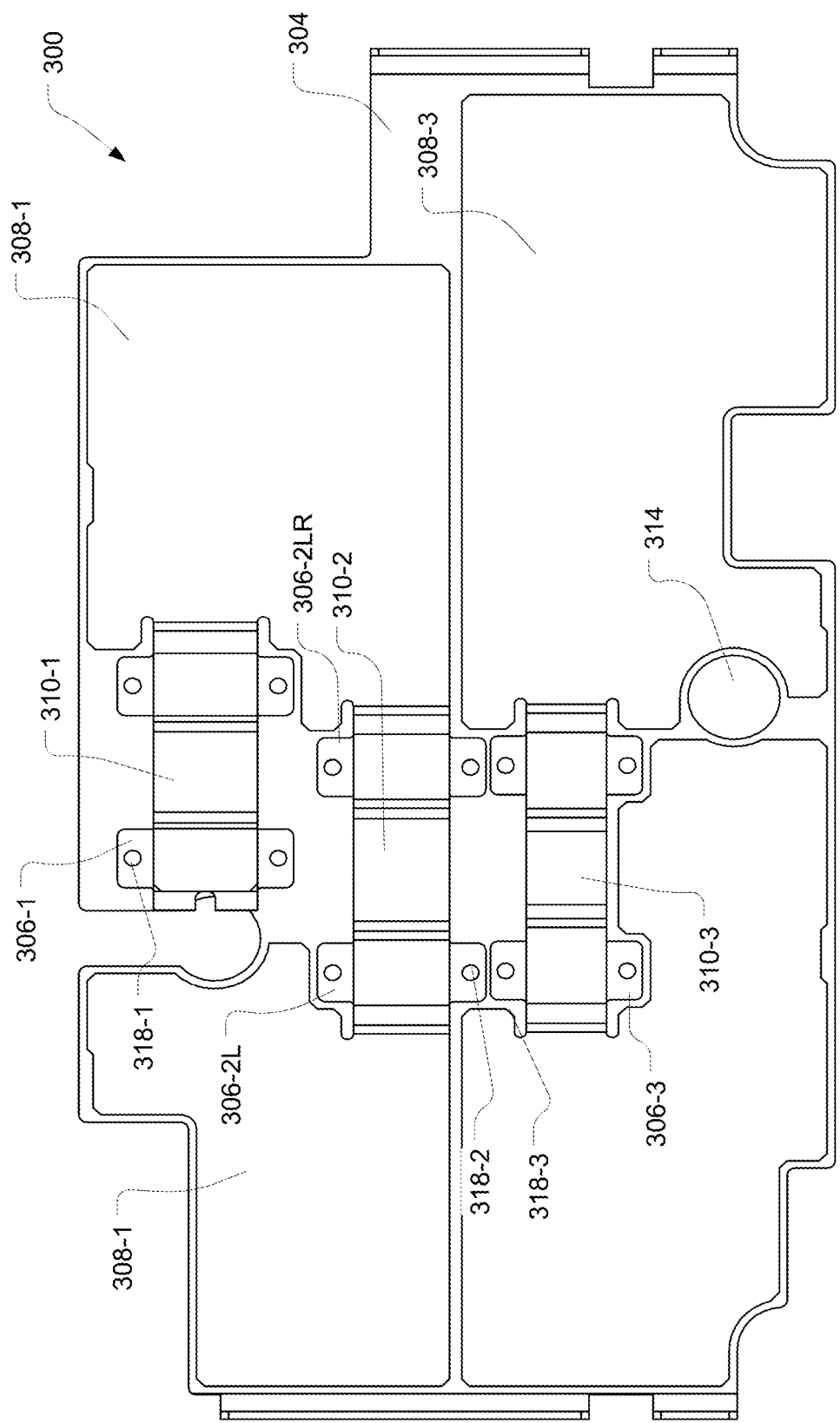
FIG. 3A is a top view of a second implementation of a heat transfer assembly and in accordance with at least one implementation of the present disclosure.
Figure 3B:
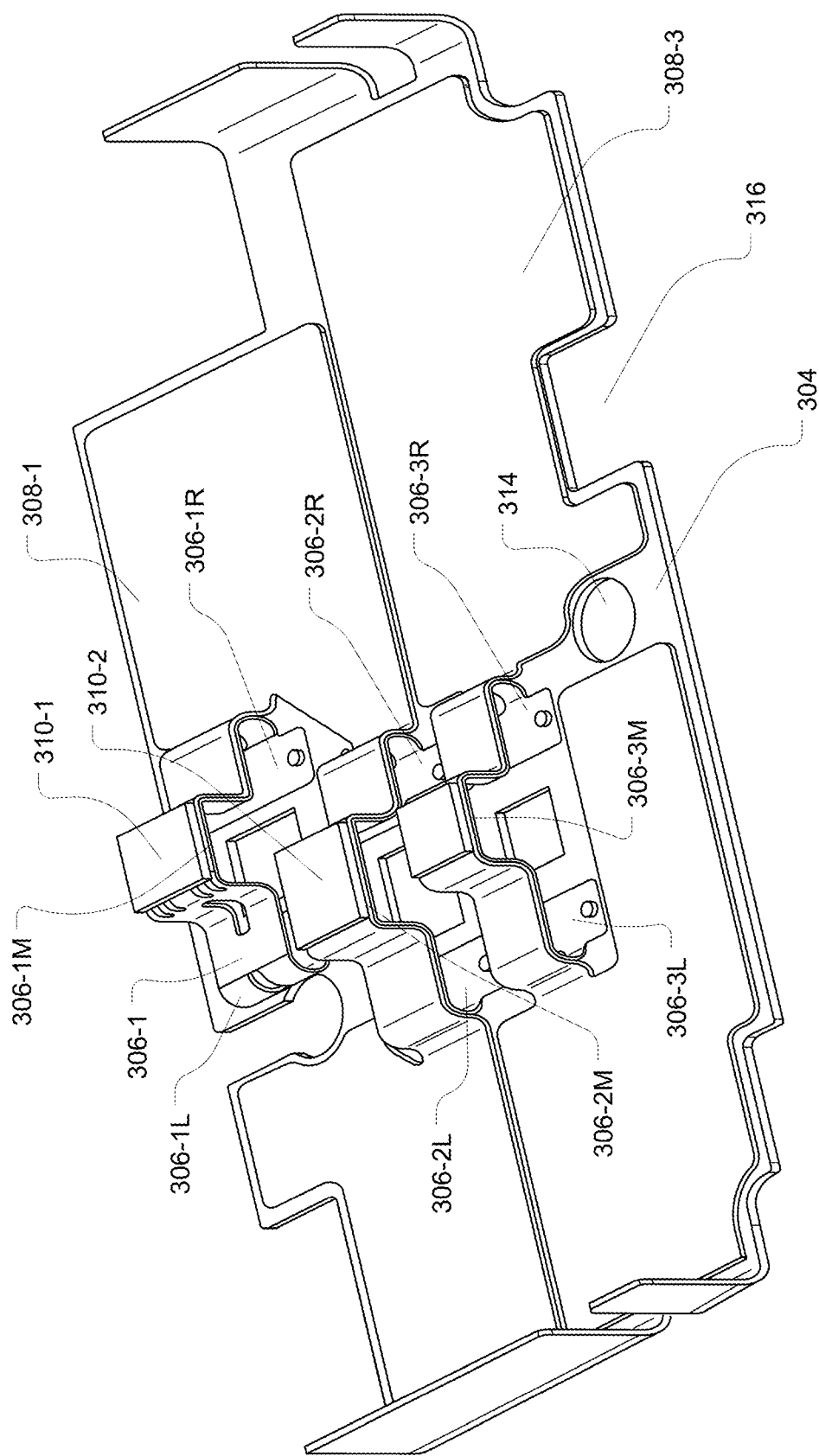
FIG. 3B is a side perspective view of the heat transfer assembly of FIG. 3A and in accordance with at least one implementation of the present disclosure.

In the present description, a first heat transfer assembly 100 and a second heat transfer assembly 300 (as shown in FIGS. 3A-3B) are shown as providing heat transfer from top surfaces of one or more heat sources 122. It is to be appreciated, that heat transfer assemblies may be used to transfer heat to/from any surface of a heat source 122 including from the top, sides, bottoms, or otherwise. The placement and configuration of a heat transfer assembly may vary from device to device based upon additional considerations including EMI, assembly/disassembly (e.g., ease/difficulty thereof), material costs, and otherwise.

For another implementation, a first heat transfer assembly 100 may include additional active and/or passive heat regulation and/or transfer elements such as radiators, vents, forced air transfer (such as by fans), liquid cooling/thermal regulation, and otherwise.

Top Cover 102 and Bottom Cover 128

A device 132 may include various external portions, including a top cover 102, a bottom cover 128 and one or more sides (not shown) (herein collectively, "covers"). The external portions of a device 132 may form any specified shape, such as a square, cube, octagon, sphere, ball, or otherwise. The covers may be configured of any specified materials, non-limiting examples including plastic, aluminum, ceramics, polymers, and otherwise. One or more of the covers may be configured to transfer heat from within the device 132 to an external environment. A cover may facilitate heat transfer from a heat plate and/or an internal device environment to an external device or element via one or more of convection, conduction, radiation, or otherwise.

For at least one implementation, a cover may be configured for use as a component of the first heat transfer assembly 100. For example, a top cover 102, a bottom cover 128, and/or another cover of a device 132 may be selected with thermal properties which facilitate a given heat transfer rate $Q^{\bullet}_C$ (the "C" in $Q^{\bullet}C$ identifying a cover's heat transfer rate) and/or a given heat flux or thermal flux $F_C$ from an internal device environment to an external device environment.

Thermal properties of a given cover portion may vary from other cover portions for a given device. A cover may be configured to provide electrical, RF, EMI, and/or other isolation, radiation, emitting, receiving, or other properties, in whole or in part. For example, a top cover 102 for a first device may be transparent to infrared signals (or other forms of RF signals including signals arising along any portion of the electromagnetic spectrum), while a top cover 102 for a second device may be opaque to infrared signals (or other RF signals).

A cover may include one or more spacer studs 112, for example, as an extension of the top cover 102, and one or more spacer sockets 130, for example, as an extension of the bottom cover 128. Such studs and sockets, or other forms of fastening members, may be used to fasten a top cover 102 with a bottom cover 128 by use of friction, compression, and the like. For example, a top cover 102 may be configured to "snap" to a bottom cover 128. Other forms of fasteners and related structures may be used for assembly, mating and fastening, directly or indirectly, of the top cover 102 with the bottom cover 128, and/or other covers for a given device 132. One or more of the top cover 102 and/or the bottom cover 128 may include one or more extensions 136. The extensions 136 may be configured to provide a separation of the top cover 102 and/or the bottom cover 128 with one or more device 132 components, such as a PCB 120. Extensions 136 may also be provided to facilitate assembly, disassembly, alignment, separation, spacing, or the like of device components, including covers, heat transfer assembly 100 components, heat sources 122, and/or other components 124.

Figure 1B:
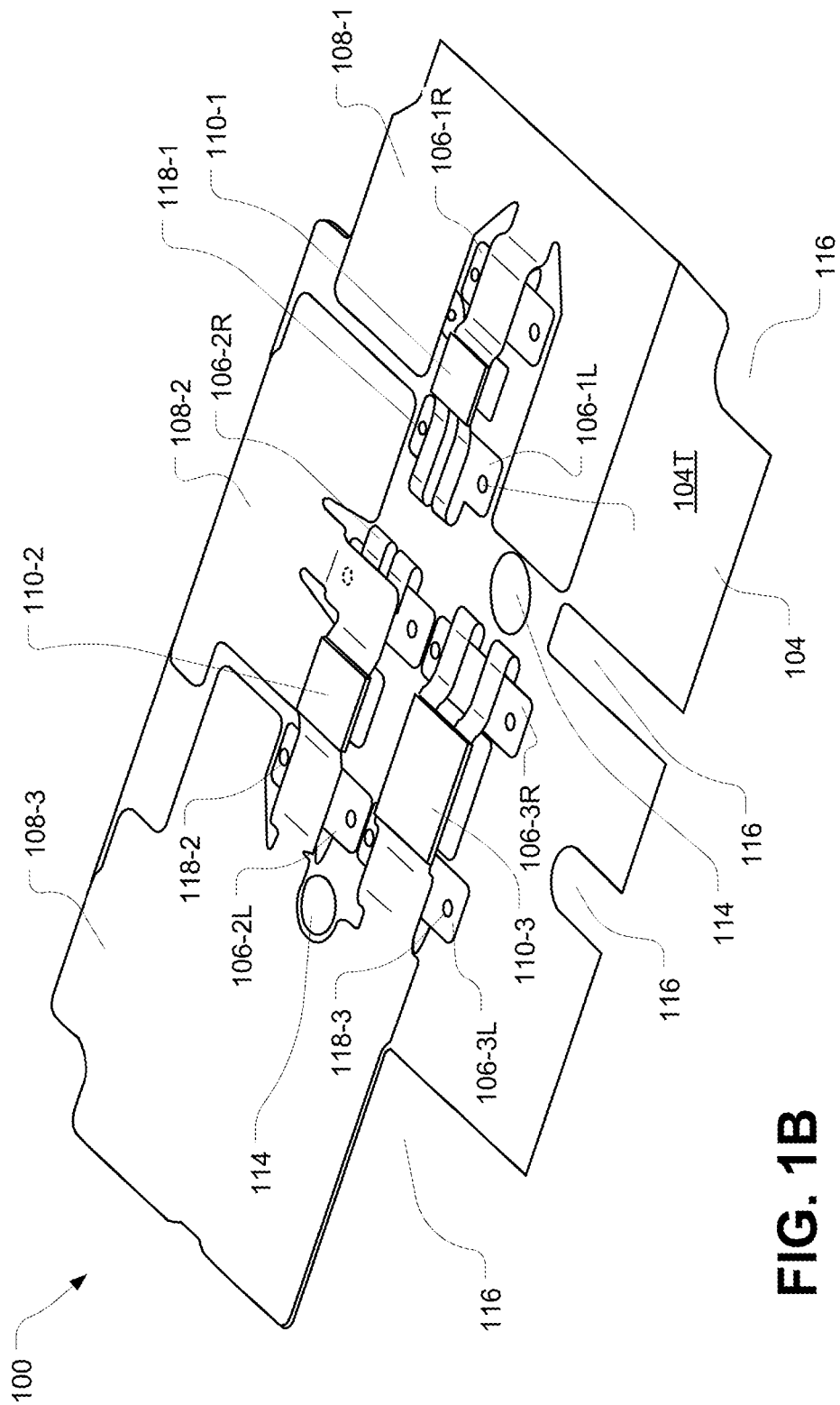
FIG. 1B is a side perspective view of the heat transfer assembly of FIG. 1A and in accordance with at least one implementation of the present disclosure.
Figure 1C:
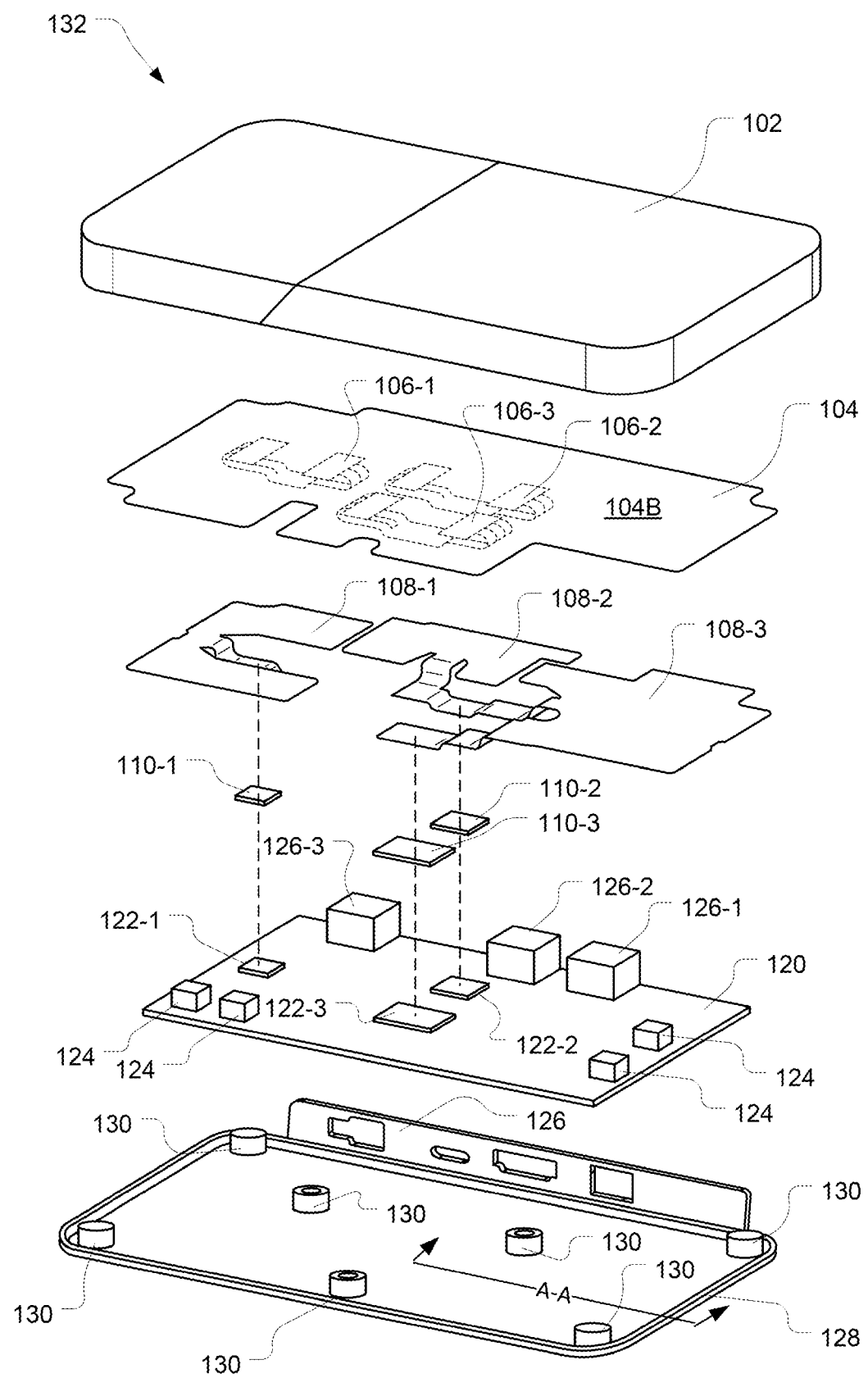
FIG. 1C is an exploded view of an electronic device that includes the heat transfer assembly of FIGS. 1A and 1B and in accordance with at least one implementation of the present disclosure.

As shown in FIG. 1C, a device 132 may include an interface panel 126 configured for use with one or more interface terminals 126-1, 126-2 and 126-3 such as, but not limited to, phone, universal serial bus (USB), HDMI (TM), Ethernet, and other interfaces for coupling a device 132 with other external devices (not shown). The interface panel 126 may be a component of a top cover 102, a bottom cover 128, or other cover for a device 132.

Figure 1D:
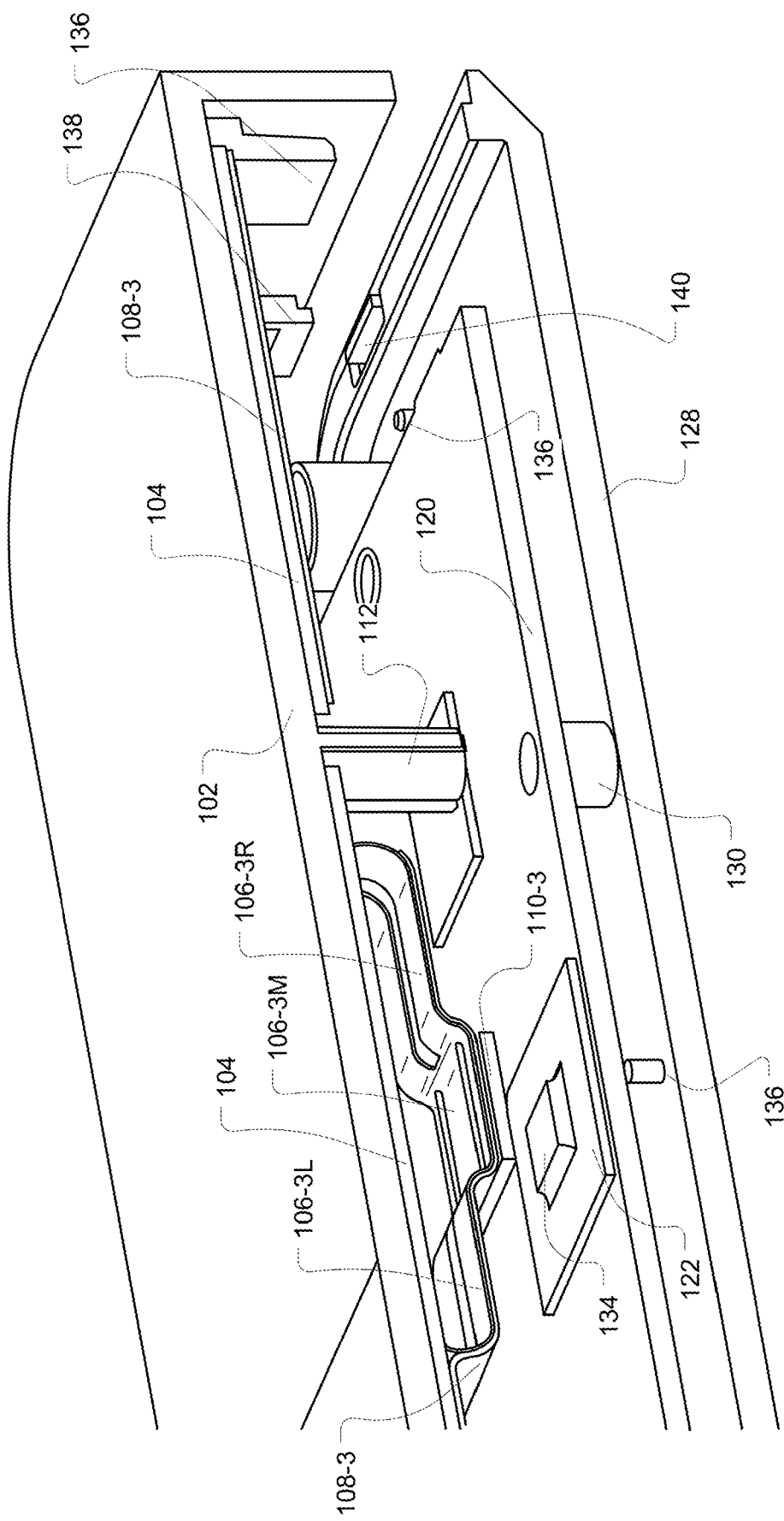
FIG. 1D is a cross-sectional view of the heat transfer assembly of FIGS. 1A and 1B, as positioned in an assembled electronic device, and as taken along line 1A-1A of FIG. 1C and in accordance with at least one implementation of the present disclosure.
Figure 1E:
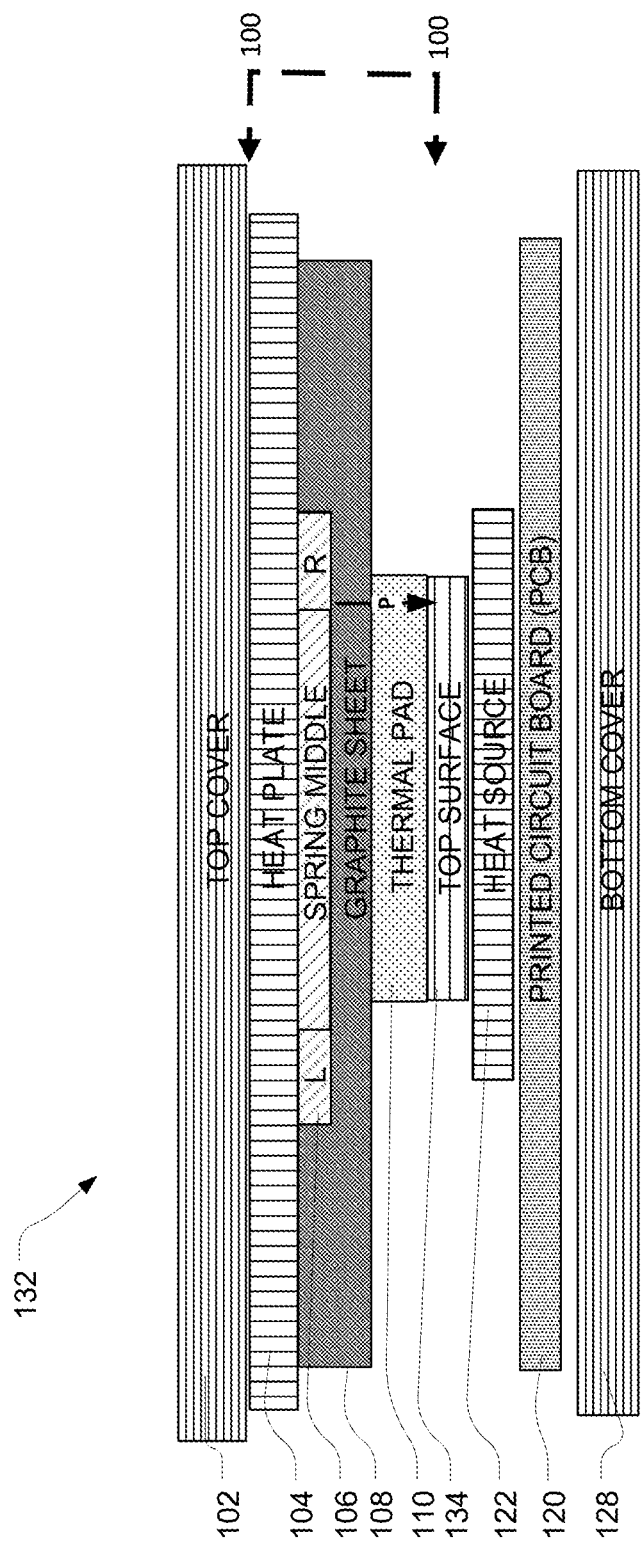
FIG. 1E is a side, partial cross-sectional view of an electronic device having a heat transfer assembly configured in accordance with at least one implementation of the present disclosure, and where the electronic device is in an assembled state.

As shown in FIG. 1D and FIG. 1E, a heat source 122 (such as a processor) may be coupled to a PCB 120. A heat source 122 may be coupled directly or indirectly to a PCB 120 by a socket (not shown) or another device component. For an implementation, the heat source 122 may include a top surface 134 configured for coupling with a thermal pad 110, such as the third thermal pad 110-3. As shown in FIG. 1D, an extending cover latch 138, as provided with the top cover 102, and a receiving cover latch 140, as provided with the bottom cover 128, may be used to facilitate fastening of the top cover 102 with the bottom cover 128. These components, and/or others, may be used to facilitate securely fasten the top cover 102 with the bottom cover 128.

Heat Plate 104

For an implementation of a heat transfer assembly, a heat plate 104 may include a top surface 104T (as shown in FIGS. 1A and 1B) and a bottom surface 104B (as shown in FIG. 1C). For at least one implementation, the heat plate 104 may include a flat top surface 104T and/or a flat bottom surface 104B. For an implementation, the heat plate 104 may be configured to have a shape that includes contours corresponding to one or more contours for a top cover 102 or for a bottom cover 128. The heat plate 104 may be configured to transfer heat to a top cover 102, bottom cover 128, side portions (not shown), or other portions of a device. The heat plate 104 may have any suitable form, shape, dimensions, or configurations.

For example, a heat plate 104 ("HP") may be selected with thermal properties which facilitate a given heat transfer rate $Q^{\bullet}_{HP}$ and/or a given heat flux or thermal flux $F_{HP}$ from a graphic sheet 108 (or a portion thereof) to one or more of an internal device environment, a top cover 102 of the device 132, and/or to an external device environment (for example, by radiation of heat using convection through one or more vents or slots in a top cover 102).

The heat plate 104 may be sized to accommodate the thermal properties and heat transfer properties specified for one or more heat sources 122 therein. The heat plate 104 may be configured to abut an enclosure, such as a top cover 102, or other member of a device 132, and to receive heat conducted from a heat source 122 in the device 132. The heat plate 104 may be configured to transfer the heat it receives from one or more heat sources 122 to an internal device environment, to an external device environment, and/or to other components 124 within a device 132.

It is to be appreciated that heat sources 122 and other components 124 within a device 132 may mechanically, thermally, and/or electrically interconnected by use of a printed circuit board (PCB) 120, wiring, or other known structures. Accordingly, the transfer of heat from any given component, such as a first heat source 122-1 is facilitated by an implementation. It is to be appreciated that the heat plate 104 may also be configured to transfer heat from one or more heat source 122 in a device 132 to one or more heat absorbing and/or other components 124 and/or environments within and/or external to a device 132.

In at least one implementation, the heat plate 104 may be constructed of aluminum. The heat plate 104 may be formed as a plate of material with a uniform or varying thickness. The heat plate 104 may be formed from two or more plates, or segments of material. For at least one implementation, the heat plate has a uniform thickness of one millimeter plus/minus ten percent (1.0 mm±10%). In other implementations, other materials may be used and/or other thicknesses thereof may be utilized to facilitate heat transfer from a heat source 122 to elsewhere within and outside of a device 132. Various other materials of various widths and configurations may be used in implementations of the present disclosure. The respective heat transfer properties of such materials are well known in the art and are not described further herein.

The heat plate 104 may be anodized to address any corrosion concerns. The heat plate 104 may be fastened to a cover, such as the top cover 102 using a fastener, such as screws, tabs, rivets, or otherwise. The heat plate 104 may be configured to have a form that includes one or more spacer openings 114, cut-outs 116, and the like. The spacer openings 114 may be provided for use in facilitating assembly of the device 132, such as the mating of spacer studs 112 with spacer sockets 130, and otherwise.

Spring 106

A first heat transfer assembly 100 may be configured to include one or more springs 106, such as first spring 106-1, second spring 106-2 and third spring 106-3. A springs 106 may include a left spring portion, e.g., 106-3L, a middle spring portion, e.g., 106-3M, and a right spring portion, e.g., 106-3R (as shown in FIG. 1D). As described, for example, in the '948 Patent and/or in the '840 Patent, the springs 106 may be configured to compress when the device 132 is in an assembled state and to decompress when the device 132 is in an unassembled state. Compression of the springs may be provided to facilitate thermal contact between a heat source 122 and a thermal pad 110. The spring portions 106-#L/M/R may be configured to transfer heat from the heat source 122, via the thermal pad 110 and graphite sheet 108 portions corresponding thereto, to and from the heat plate 104.

For at least one implementation, the springs 106 may be secured to a heat plate 104 using one or more fasteners 118. The fasteners 118 may be of any type and have any configuration, such as rivets, screws, adhesive bonding, welded bonding, or the like. The fasteners 118 may be used at one or more locations to secure a mechanically and thermally couple a spring 106 to a heat plate 104. The sizing of the fasteners 118, positioning thereof, and otherwise may vary based upon the size of the spring 104, the anticipated amount of vertical, horizontal, and/or shear forces imparted on the spring 104 when in one or more of various states, such as when the device 132 is in an unassembled state and/or an assembled stated, and in view of other factors known in the art, such as the heat conductive properties of materials and otherwise.

The springs 106 may include a middle portion, e.g., 106-3M, sized and configured to generate contact of a thermal pad 110 and a top surface area of a heat source 122. The top surface of the heat source 122 may have any specified geometric shape. For at least one implementation, the top surface of a heat source 122 is a flat surface. In other implementations, a spring 106 may be configured to abut and/or contact other surface areas of a heat source 122 and/or other components 124, such as a bottom, a side, an extension, combinations thereof, or otherwise.

For at least one implementation, the middle portion of a spring 106 (e.g., 106-3M) may be configured to not bend vertically while the device 132 is in an assembled state and/or in an unassembled state. The left portion of the spring 106 (e.g., 106-3L) and/or right portion of the spring (e.g., 106-3R) may be configured to bend, straighten, compress, decompress, deflect and otherwise while the device 132 is in an assembled stated and/or transitioning between an assembled state and an unassembled state. It is to be appreciated that by varying the thickness of the material used at one or more locations along a spring 106 vertical and/or horizontal movements of the spring 106 may occur during transitions between assembled and unassembled device states and while the device is in the assembled state. The amount of vertical and/or horizontal movement may be controlled in view of one or more design considerations.

For at least one implementation, a spring 106 may be constructed from phosphorus bronze material. For at least one implementation, the spring 106 may be constructed from electrically non-conductive materials. For an implementation, the spring 106 may be mechanically and/or electrically isolated from other device 132 components. For an implementation, the spring 106 is rigidly attached so as to prevent lateral displacement of the spring 106 relative to the graphite sheet 108. For an implementation, the springs 106 may be symmetrically configured such that the left portion is symmetrical with the right portion. For an implementation, a spring 106 may be configured to provide for limited deflection thereof when the device 132 is in the assembled state. As used herein, "limited deflection" refers to a deflection of a spring 106, when under pressure, of less than one millimeter (1 mm). For at least one implementation, the spring 104 may be configured to vertically deflect, between one and four millimeters (1-4 mm). It is to be appreciated that other extensions and/or vertical deflections of a spring 106 may arise when the spring 106 is used for any given implementation of an implementation of the present disclosure. Spring extensions/deflections may vary by spring when multiple springs are used for a given device. Other materials, any specified lengths, widths and/or thicknesses, amount of deflection, and otherwise may be used for any given implementation of a spring 106 in accordance with an implementation of the present disclosure.

It is to be appreciated that the amount of extension and deflection of the spring 106 may be customized in view of the properties chosen for a given spring 106 and that such properties may be selected such that any extension and deflection of the spring 106 when in the assembled state provides the specified amount of pressure "P" (as shown in FIG. 1E) by the spring 106 on the heat source 122. For at least one implementation, a spring 106 may be configured to fill one or more gaps that would otherwise exist, absent use of the spring 106, graphite sheet 108, thermal pad 110, and RF shield 400 (if any, see FIG. 4 and as further described below), between the heat plate 104 and the heat source when a device 132 is in the assembled state.

A spring (S) 106 may be selected with thermal properties which facilitate a given heat transfer rate $Q\ensuremath{^\cdot}_S$ and/or a given heat flux or thermal flux $F_S$ from a portion of a graphite sheet 108 to a heat plate 104.

Graphite Sheet 108

A first heat transfer assembly 100 may be configured to include one or more graphite sheets 108, such as a first graphite sheet 108-1, a second graphite sheet 108-2 and a third graphite sheet 108-3. The graphite sheets 108 may have any specified configuration and/or form, as shown by the variations between the first, second and third graphite sheets 108-1/2/3 in FIGS. 1A-1C. A graphite sheet (GS) 108 may be selected with thermal properties which facilitate a given heat transfer rate $Q\ensuremath{^\cdot}_{GS}$ and/or a given heat flux or thermal flux $F_{GS}$ from a thermal pad 110 to a heat plate 104 and/or to a spring 106.

A graphite sheet 108 may be configured to facilitate heat transfer within an electronic device along an x-y plane such as, when the graphite sheet 108 is flat. The graphite sheet 108 may be configured to mechanically contact the thermal pad 110, one or more spring 106 portions, and one or more portions of a heat plate 104. The graphite sheet 108 may provide electrical isolation between such first heat transfer assembly 100 components and/other components, if any, in contact with the graphite sheet 100. The graphite sheet 100 may facilitate thermal conduction while minimizing and/or inhibiting electrical conduction.

Figure 2:
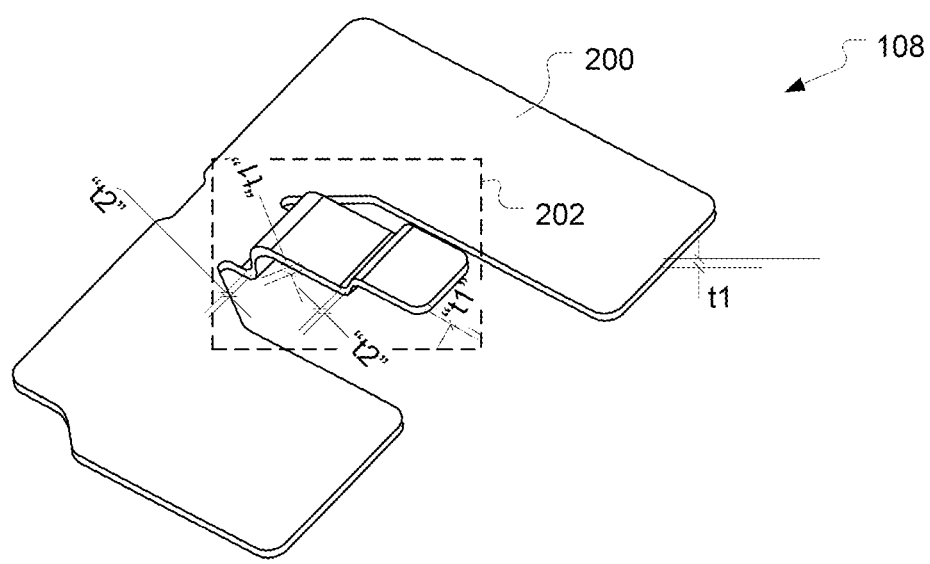
FIG. 2 is a side perspective view of a thermal conductive sheet configured for use in a heat transfer assembly including, but not limited to, the heat transfer assembly of FIGS. 1A-1D, and in accordance with at least one implementation of the present disclosure.

As shown in FIG. 2, a graphite sheet 108 may have a configuration that includes a planar portion 200 having a first thickness "t1" that extends along a span of a heat plate 104 and one or more spring contour portions 202 that extends along portions of a given spring 106 (such as a spring middle portion, e.g., 106-3M). The spring contour portion 202 may include portions having the first thickness t1 and/or a second thickness "t2," where the second thickness t2 corresponds to locations of the given spring 106 that deflect and extend when a device 132 is, respectively, in an assembled and an unassembled state. For at least one implementation, the first thickness is less than the second thickness (i.e., t1<t2). For another implementation, the first thickness is equal to the second thickness (i.e., t1=t2). For an implementation, t1=0.4 mm±10%. For another implementation, t1=0.28 mm. For another implementation, t2=t1±10%. The thicknesses of one or more portions of a graphite sheet 106 may correspond to one more specified thermal properties for the graphite sheet and/or portion thereof.

For an implementation, a graphite sheet 108 may include one or more laminated surfaces, where such lamination facilitates electrical isolation of the graphite sheet 108 from another component of a device 132. For an implementation, a given graphite sheet 108 may be configured in view of RF and EMI considerations.

For an implementation, a graphite sheet 108 may be flexible in one more areas thereof. A graphite sheet 108 may include an adhesive layer configured to facilitate mechanical coupling of the graphite sheet 108 with one or more portions of a spring 106 and/or one or more portions a heat plate 104. A graphite sheet 108 may be provided in a sheet configuration, in a pre-formed configuration, configured for use with a given spring, and otherwise.

For an implementation, a graphite sheet 108 may include a NEOGRAF graphite sheet that is 0.34 mm thick, with an adhesive backing, and includes a release liner that is 0.08 mm thick.

Thermal Pad 110

A first heat transfer assembly 100 may include use of a thermal pad 110. A thermal pad (TP) 110 may be selected with thermal properties which facilitate a given heat transfer rate $Q^{\cdot}_{TP}$ and/or a given heat flux or thermal flux $F_{TP}$ from a heat source 122 to a graphite sheet 108. In accordance with at least one implementation, a thermal pad 110 may include a silicone elastomer with thermal conductivity properties of approximately 8.5 W/mK over a temperature range of approximately 40 to 150 degrees Celsius.

For at least one implementation, a thermal pad 110 may have a thickness of approximately one millimeter (1.0 mm) with a thickness tolerance of twenty percent (20%). A thermal pad 110 may be sized to the dimensions of a surface area or a portion thereof, such as a top surface of a heat source 122. Other implementations may use thermal pads having different characteristics and size, as specified for any given implementation of an implementation of the present disclosure.

For an implementation, SARCON (TM) PG80A and/or PG80B thermal interface materials, as manufactured by FUJIPOLY Inc., may be used for a thermal pad 110. The thickness of a thermal pad 110 may vary by implementation and considerations including, but not limited to, heat conductivity specified, electrical conductivity specified/non-specified, RF/EMI signal distortion/interference properties, and otherwise. A thermal pad 110 may include an adhesive or similar backing for use in mechanically fastening the thermal pad to the graphite sheet 108. The use, configuration and properties of thermal pads are well-known in the art and the present disclosure is not limited to any given type of configuration of thermal pad.

In FIG. 1E, an assembled device 132 including a first heat transfer assembly 100 for a first heat source is shown. As shown, the device 132 includes a top cover 102, coupled to a first heat plate 104. The first heat plate 104 is further coupled to a first spring 106 having a left portion 106-L, a middle portion 106-M, and a right portion 106-R, and to a first graphite sheet 106. The first graphite sheet 106 is further coupled to, at least, the middle portion 106-M of the first spring 106, and to a first thermal pad 108. The first thermal pad 108 is coupled to a heat source 122 with the spring 106 providing a compressive force "P" onto the heat source 122, at contact points with the first thermal pad 108.

When the device 132 is in operation, the heat sources 122 generate a quantity of heat J, for example, the first heat source 122-1 generates a first heat J1. It is to be appreciated that J1 may vary over time and with device operations. The quantity of heat transferred, by the various components of an implementation of a heat transfer assembly of the present disclosure, is a function of the heat transfer rate $Q^{\cdot}$ and the heat flux F for a given component. The heat transfer rate of the various components may be the same or different for any given implementation.

Accordingly, a heat transfer assembly 100 may be configured to transfer by conduction, convection and/or radiation a portion TJ1 of the first heat J1 generated by a first heat source 122-1 to an external environment. To transfer the portion TJ1, a first transfer of a first portion T1J1 of the first heat J1 is from the first heat source 122-1 to a first thermal pad 110-1. A second transfer of a second portion T2J1 of the first heat J1, which is also a portion of the first portion T1J1, is from the first thermal pad 110-1 to the first graphite sheet 108-1. A third transfer of a third portion T3J1 of the first heat J1, which is also referred to herein as a portion of the second heat T2J1, is from the first graphite sheet 108-1 to the heat plate 104. A fourth transfer of a fourth portion T4J1 of the first heat J1, which is also referred to herein as a fourth portion of the third heat T3J1, is from the heat plate 104 to the top cover 102. Last, a fifth transfer T5J1 of the portion TJ1 of the first heat is from the top cover 102 to the external environment. It is to be appreciated that one or more of the heat transfers occur using conduction, convection, and/or radiation. For an implementation and under ideal conditions T1J1=T2J1=T3J1=T4J1=T5J1=TJ1. Under non-ideal conditions and for at least one implementation, T1J1>T2J1>T3J1>T4J1>T5J1>TJ1. Further, the first spring 106-1 may transfer a sixth portion T6J1 of the first heat J1 from the first graphite sheet 108-1 to the heat plate 104. Typically, the sixth portion T6J1 is negligible compared to the third portion T3J1.

Implementation of a Second Heat Transfer Assembly 300

In FIGS. 3A and 3B, a second implementation of a second heat transfer assembly 300 is shown. The second heat transfer assembly 300 varies from the first heat transfer assembly 100 implementation by the layout and configuration and placements of the second heat plate 304, second springs 306, second graphite sheets 308, and second thermal pads 310. Otherwise, components utilized by the first and second implementations may be common or otherwise vary to meet a specified thermal property.

More specifically, the second heat transfer assembly 300 includes a second heat plate 304, one or more second springs 306 (including, but not limited to, a first-second spring 306-1, a second-second spring 306-2, and a third second spring 306-3), one or more second graphite sheets (including, but not limited to, a first-second graphite sheet 308-1 and a third-second graphite sheet 308-3), and one or more second thermal pads 308 (including a first-second thermal pad 310-1, a second-second thermal pad 310-2, and a third-second thermal pad 310-3). As shown, the first-second graphite sheet 308-1 may be configured to couple, thermally and mechanically, with the first-second spring 306-1, the second-second spring 306-2, the first-second thermal pad 310-1 and the second-second thermal pad 310-2. The second heat transfer assembly 300 may further includes various spacer openings 314, cut-outs 316, and use of fasteners 318 to secure the first-second springs 306-1/2/3 to the second heat plate 304.

RF Shield for use with an Implementation of a Heat Transfer Assembly

Figure 4:
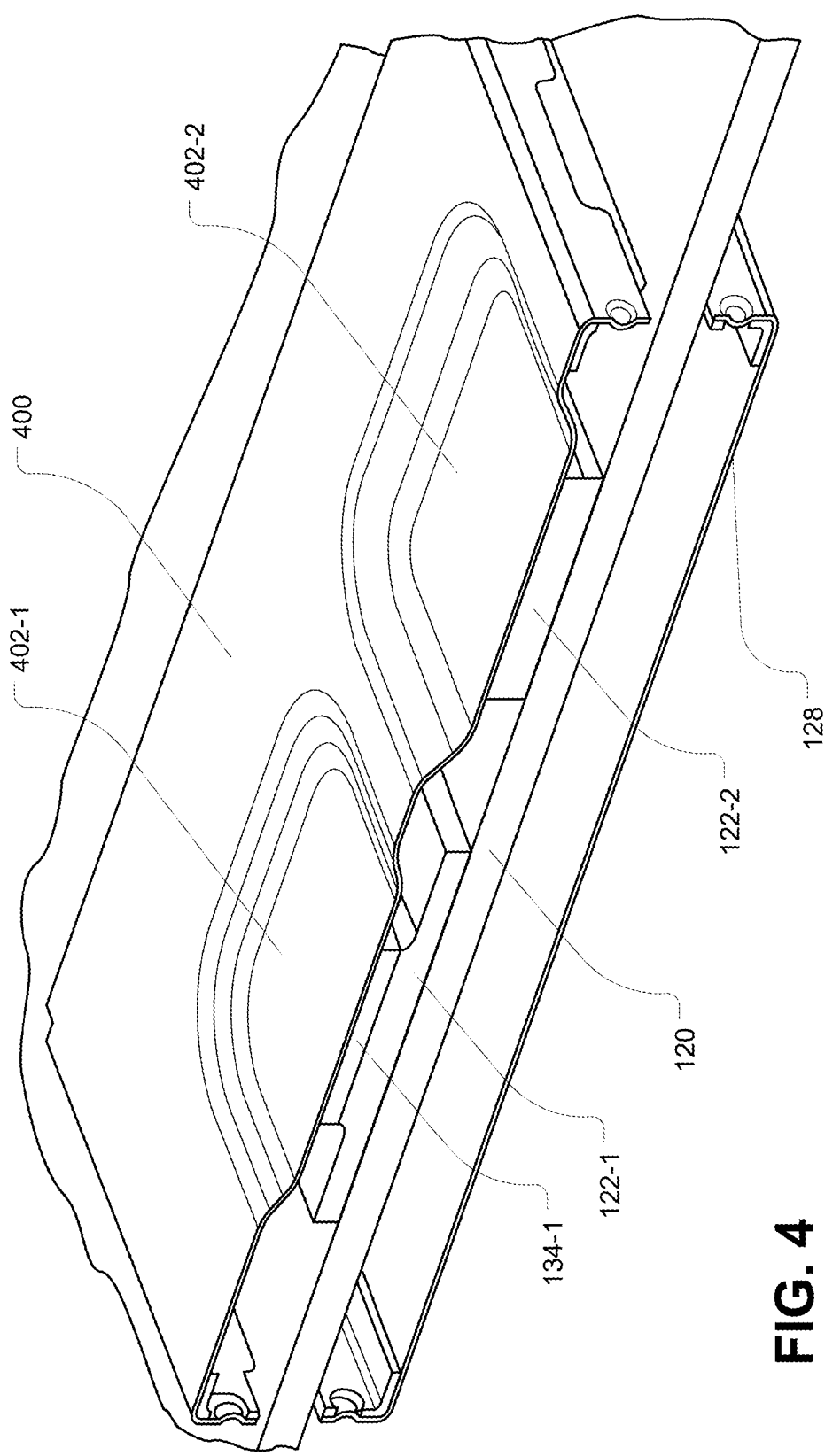
FIG. 4 is a side perspective view of a metal shield for use with a heat transfer assembly and in accordance with at least one implementation of the present disclosure.

As shown in FIG. 4 (and with reference to FIGS. 1A-1D, 2 and 3), an RF shield (RFS) 400 may be provided in an implementation of a heat transfer assembly of the present disclosure. The RF shield 400 may be configured to facilitate RF shielding of a heat source 122 or other components 124 while also be configured to accept placement of a thermal pad 110 about a surface of a heat source 122 to facilitate a specified heat transfer from the heat source 122 to the thermal pad 110 and otherwise. The RF shield 400 may be configured from any material, in any configuration, layout, and otherwise to meet a given RF rating, EMI constraint, or otherwise. The RF shield 400 may be configured to prevent RF signals and/or EMI from radiating to and/or from a given heat source 122. The given heat source 122 may be RF signal/EMI isolated by the RF shield with respect to one or more directions, while permitting and/or facilitating RF signal/EMI radiation in one or more other directions, if any.

An RF shield 400 may be selected with thermal properties which facilitate a given heat transfer rate $Q^{\bullet}_{RFS}$ and/or a given heat flux or thermal flux $F_{RFS}$ from a heat source 122 to a thermal pad 110.

An additional one or more second thermal pads (not shown) may be used in conjunction with use of an RF shield 400 and an implementation of a heat transfer assembly that includes a first thermal pad to facilitate a specified quantity of mechanical and thermal coupling (as may be expressed as a pressure exerted by the second pad on a given thermal source by the heat transfer assembly 100/300 when a device 132 is in an assembled state). By use of a second thermal pad, common thermal pads may be sourced for use with devices containing heat sources for which RF shielding is used and other heat sources for which RF shielding is not used.

As shown in FIG. 4, an RF shield 400 may include one or more recesses 402, such as a first recess 402-1 and a second recess 402-2. A given recess 402 may have any specified shape and/or configuration. The use of one or more recesses 402 may facilitate a device 132 having a reduced overall height. A given recess may reduce a quantity (as measured in terms of thickness or other dimensions) of thermal padding used to establish a given quantity of thermally coupling, as expressed for example in a given thermal flux, between a heat source 122 and an implementation of a heat transfer assembly 100/300. An RF shield 400 may not include any recesses.

An RF shield 400 may be soldered or other mechanically fastened to a PCB 120 or otherwise. Such soldering/fastening may result in a given second heat transfer rate $Q^{\bullet}_{RFS-2}$ and/or a given second heat flux or thermal flux $F_{RFS-2}$ transfer from a heat source 122, to the RF shield 400, to the PCB 120, and to one or more other components 124 on the PCB 120 or elsewhere within the device 132 and/or to a cover of the device 132. Accordingly, it is to be appreciated that known heat isolation components and/or techniques may be used to minimize, reduce, prevent or otherwise control transfer of heat from a heat source 122, via the RF shield 400, to the PCB 120 and elsewhere.

An RF shield 400 may be electrically grounded. An RF shield 400 may encompass a heat source 122 and/or other components of a device to operate as a Faraday cage, providing isolation of a given component of a device from RF signals and/or EMI.

Figure 5:
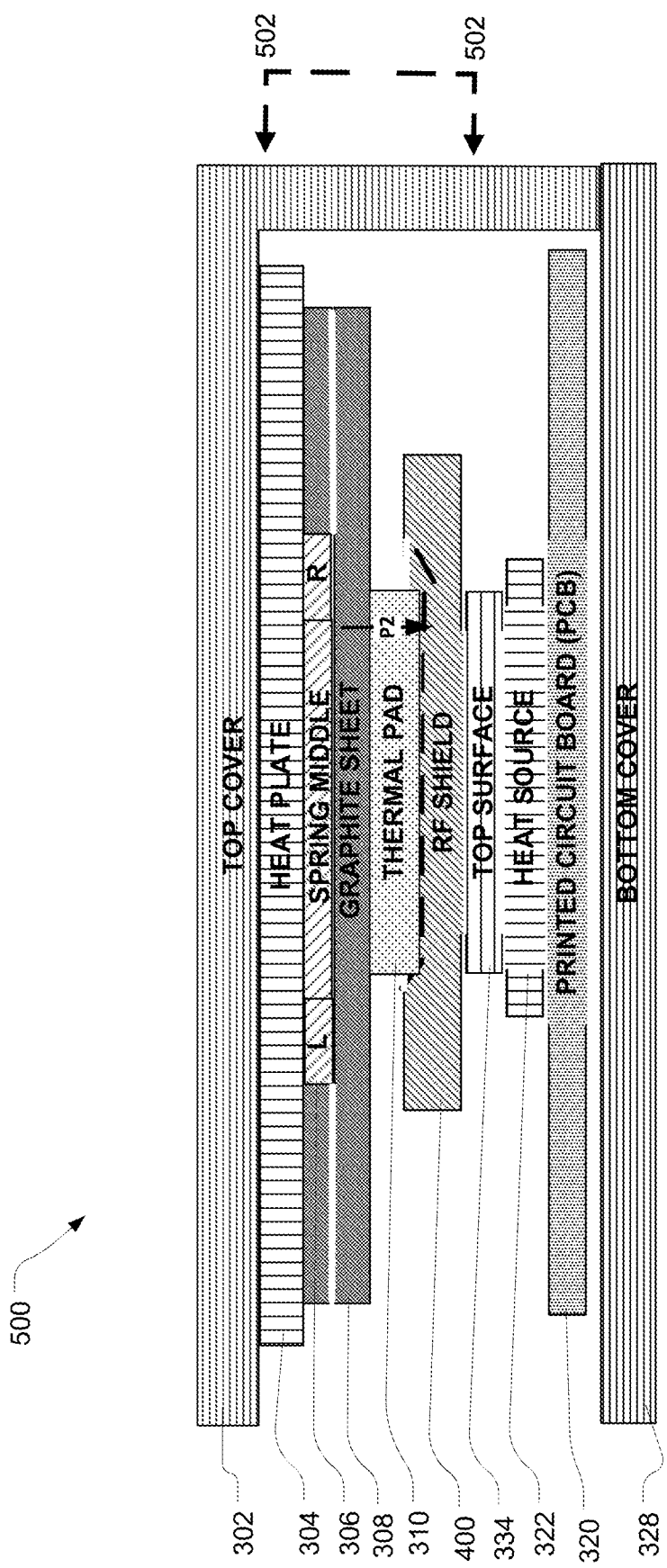
FIG. 5 is a side, partial cross-sectional view of a radio-frequency (RF) shielded electronic device having a heat transfer assembly configured in accordance with at least one implementation of the present disclosure, and where the electronic device is in an assembled state.

In FIG. 5, an implementation of a shielded device 500 is shown that includes a heat transfer assembly 502 and an RF shield 400. As shown, the shielded device 500 includes a second top cover 302, coupled to a second heat plate 304. The second heat plate 304 is further coupled to a second spring 306 having a left portion 306-L, a middle portion 306-M, and a right portion 306-R, and to a second graphite sheet 308. The second graphite sheet 308 is further coupled to, at least, the middle portion 306-M of the second spring 306, and to a second thermal pad 308. The second thermal pad 308 is coupled to an RF shield 400, that is coupled to a second heat source 322 by a second compressive force (P2) provided by the second spring 306 onto the second thermal pad 310 and onto the RF shield 400. For at least one implementation, the second compressive force P2 causes a downward (towards the bottom cover 328) deflection of the RF shield 400 proximate to the area of the second thermal pad 310 to facilitate thermal, although mechanically indirect, coupling of the second thermal pad 310 with the second heat source 322. For another implementation, the second compressive force P2 does not cause a downward deflection of the RF shield 400.

As shown in FIG. 6 and for at least one implementation, a method of assembling a heat transfer assembly 100 may include configuring a heat plate to correspond to a cover of a device (Operation 602). The operations may include attaching a spring onto the heat plate at a first location (Operation 604). The first location corresponds to a middle portion of the spring and, when the device is in an assembled state, a top surface of a heat source within the device (Operation 606). The operations may include attaching a graphite sheet to the heat plate (Operation 608). The operations may include attaching the graphic sheet to extend over the middle portion of the spring (Operation 610). The operations may include attaching a thermal pad to the graphite sheet at the first location (Operation 612).

An implementation of the present disclosure may use one or more of the above operations and other operations to provide a heat transfer assembly for use in a device to transfer heat from a heat source in the device. The use of such a heat transfer assembly may include the operations of positioning the heat transfer assembly in a first portion of the device, such as a top cover, such that a spring on the heat transfer assembly is aligned above a heat source in the device, wherein the component is position in a bottom cover. The operations may also include applying a downward force on the top cover while it is aligned with the bottom cover such that corresponding force is exerted by the spring onto the heat source via a graphic sheet and a thermal mat. The spring translates the downward force into a vertical deflection of the spring, which imparts a second downward force on the thermal mat such a specified thermal flux between the heat source and the thermal mat is attained. The second downward force is applied while the device is in an assembled state. The top cover is secured to the bottom cover during operation of the device and while the device is in the assembled state. The fastening of the top cover to the bottom cover may occur using any known methods and components.

The various implementations of the present disclosure also provide for an assembled electronic device wherein heat from a component in such device (i.e., a heat source) is transferred by a heat transfer assembly configured according to the above description.

Although various implementations have been described above with a certain degree of particularity, or with reference to one or more individual implementations, those skilled in the art could make numerous alterations to the disclosed implementations without departing from the spirit or scope of the present disclosure. The use of the terms "approximately" or "substantially" means that a value of an element has a parameter that is expected to be close to a stated value or position. As is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more implementations of the present disclosure. It is also to be appreciated that the terms "top" and "bottom", "left" and "right", "up" or "down", "first", "second", "before", "after", and other similar terms are used for description and ease of reference purposes and are not intended to be limiting to any orientation or configuration of any elements or sequences of operations for the various implementations of the present disclosure. Further, the terms "and" and "or" are not intended to be used in a limiting or expansive nature and cover any possible range of combinations of elements and operations of an implementation of the present disclosure. Other implementations are therefore contemplated. It is intended that matter contained in the above description and shown in the accompanying drawings shall be interpreted as illustrative of implementations and not limiting. Changes in detail or structure may be made without departing from the basic elements of the present disclosure as recited in the following and/or any later submitted claims in the present application or in a related application.

What is claimed is:

1. A heat transfer assembly comprising:
   a heat plate;
   a first thermal conductive sheet directly thermally coupled to and extending over at least a portion of the heat plate; and
   a first thermal pad directly thermally coupled to the first thermal conductive sheet;
   wherein, during operation of a device having a first heat source generating a first heat ("J1"),
      the first thermal pad is directly thermally coupled to the first heat source;
      the first thermal pad directly transfers the first heat J1 from the first heat source to the first thermal pad;
      the first thermal conductive sheet directly transfers the first heat J1 from the thermal pad to the first thermal conductive sheet; and
      the heat plate directly transfers the first heat J1 from the thermal conductive sheet to the heat plate.

2. The heat transfer assembly of claim 1,
   wherein the device, when assembled in an operative state, comprises:
      a top cover;
      a bottom cover mechanically coupled to the top cover;
         a printed circuit board (PCB) fastened to the bottom cover; and
      the first heat source coupled to the PCB and generating the first heat J1 during device operation.

3. The heat transfer assembly of claim 2;
   wherein the transfer of the first heat J1 from the heat source to the first thermal pad further comprises:
      transferring a first portion ("T1J1") of a portion ("TJ1") of the first heat J1; and
   wherein the transfer of the first heat J1 from the first thermal pad to the first thermal conductive sheet further comprises:
      transferring a second portion ("T2J1") of the first heat J1.

4. The heat transfer assembly of claim 3,
   wherein the transfer of the first heat J1 from the thermal conduct sheet to the heat plate, further comprises:
      transferring a third portion ("T3J1") of the first heat J1.

5. The heat transfer assembly of claim 4,
   wherein a fourth transfer of the first heat J1 from the heat plate to the top cover comprises:
      transferring a fourth portion ("T4J1") of the first heat J1.

6. The heat transfer assembly of claim 5,
   wherein a fifth transfer of the first heat J1 from the top cover to an external environment comprises:
      transferring a fifth portion ("T5J1") of the first heat J1.

7. The heat transfer assembly of claim 6, wherein:
   T1J1>T2J1;
   T2J1>T3J1;
   T3J1>T4J1;
   T4J1>T5J1; and
   T5J1≈TJ1.

8. The heat transfer assembly of claim 2, further comprising:
   a first spring, coupled to the heat plate, comprising a left portion, a middle portion, and a right portion;
   wherein the first thermal conductive sheet further extends over the middle portion of the first spring;
   wherein the first spring is coupled to the heat plate at the left portion and the right portion;
   wherein, when the device is assembled, the middle portion of the first spring, compresses and applies a pressure ("P") onto the first thermal pad; and
   wherein the pressure P enhances thermal contact between the first thermal pad and a top surface of the first heat source.

9. The heat transfer assembly of claim 8,
   wherein the first spring transfers a sixth portion ("T6J1") of the first heat J1 from the first thermal conductive sheet to the heat plate.

10. The heat transfer assembly of claim 2, further comprising:
   a Radio Frequency (RF) shield positioned between the first heat source and the first thermal pad.

11. The heat transfer assembly of claim 10, further comprising:
   a first spring, coupled to the heat plate, comprising a left portion, a middle portion, and a right portion;

wherein the first thermal conductive sheet further extends over the middle portion of the first spring;

wherein the first spring is coupled to the heat plate at the left portion and the right portion;

wherein, when the device is assembled, the middle portion of the first spring, compresses and applies a pressure ("P") onto the first thermal pad; and wherein the pressure P enhances thermal contact between the first thermal pad and a top surface of the first heat source.

12. The heat transfer assembly of claim 10, wherein the RF shield is electrically grounded.

13. The heat spreader assembly of claim 2,
wherein the first heat source further comprises at least one of a central processing unit, a graphics processor, and a memory device.

14. The heat transfer assembly of claim 1,
wherein the first thermal conductive sheet is a graphite sheet.

15. The heat transfer assembly of claim 14,
wherein the graphite sheet has a thickness of 0.4 mm.

16. The heat transfer assembly of claim 15,
wherein the heat plate is an aluminum plate.

17. The heat transfer assembly of claim 16,
wherein the first thermal pad has a thermal conductivity of 8.5 W/mK over a temperature range of 40 to 150 degrees Celsius.

18. A method of assembling a heat transfer assembly comprising:

configuring a heat plate to correspond to at least a portion of a cover for a device;

attaching a thermal conductive sheet directly to the heat plate; and attaching a thermal pad directly to the thermal conductive sheet at a first location;

wherein the thermal pad, when attached directly to the thermal conductive sheet and when the device is operative, corresponds to a location in the device above a top surface of a heat source; and wherein, via the thermal pad, the thermal conductive sheet, and the heat plate, thermal energy generated by the heat source is transferred to the cover of the device.

19. The method of claim 18 further comprising:
attaching a spring onto the heat plate;
wherein, when assembled into the device a middle portion of the spring corresponds to an extension of the location of the top surface of the heat source; and
extending the thermal conductive sheet over the middle portion of the spring; and
wherein the spring applies a pressure ("P") through the thermal conductive sheet onto the thermal pad which enhances a thermal flux between the thermal pad and the top surface of the heat source.

20. The method of claim 19,
wherein the thermal conductive sheet further comprises graphite.

* * * * *